(12) United States Patent
Fisher et al.

(10) Patent No.: US 11,827,976 B2
(45) Date of Patent: Nov. 28, 2023

(54) SYSTEMS AND METHODS FOR HOMOGENOUS INTERMIXING OF PRECURSORS IN ALLOY ATOMIC LAYER DEPOSITION

(71) Applicant: LAM RESEARCH CORPORATION, Fremont, CA (US)

(72) Inventors: Ilanit Fisher, San Jose, CA (US); Raashina Humayun, Los Altos, CA (US); Michal Danek, Cupertino, CA (US); Patrick Van Cleemput, West Linn, OR (US); Shruti Thombare, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 175 days.

(21) Appl. No.: 16/954,255

(22) PCT Filed: Dec. 6, 2018

(86) PCT No.: PCT/US2018/064174
§ 371 (c)(1),
(2) Date: Jun. 16, 2020

(87) PCT Pub. No.: WO2019/125774
PCT Pub. Date: Jun. 27, 2019

(65) Prior Publication Data
US 2020/0407842 A1 Dec. 31, 2020

Related U.S. Application Data
(60) Provisional application No. 62/608,273, filed on Dec. 20, 2017.

(51) Int. Cl.
C23C 16/06 (2006.01)
H01L 21/285 (2006.01)
(Continued)

(52) U.S. Cl.
CPC ........ *C23C 16/06* (2013.01); *C23C 16/45527* (2013.01); *C23C 16/45544* (2013.01); *H01L 21/28556* (2013.01); *H01L 21/32051* (2013.01)

(58) Field of Classification Search
CPC .............. C23C 16/06; C23C 16/45527; H01L 21/28556; H01L 21/32051;
(Continued)

(56) References Cited

U.S. PATENT DOCUMENTS

| 6,537,613 B1 | 3/2003 | Senzaki et al. |
| 2005/0233156 A1 | 10/2005 | Senzaki et al. |

(Continued)

FOREIGN PATENT DOCUMENTS

| CN | 105026614 A | * 11/2015 | ....... C23C 16/45544 |
| JP | 3027378 B1 | 4/2000 | |
| JP | 2000273634 A | 10/2000 | |

OTHER PUBLICATIONS

International Search Report and Written Opinion of the ISA issued in PCT/US2018/064174, dated Mar. 27, 2019; ISA/KR.
(Continued)

*Primary Examiner* — Selim U Ahmed
*Assistant Examiner* — Evan G Clinton (57) ABSTRACT

A method includes arranging a substrate in a processing chamber, and exposing the substrate to a gas mixture including a first metal precursor gas and a second metal precursor gas to deposit a first metal precursor and a second metal precursor onto the substrate at the same time. The method further includes purging the processing chamber, supplying a reactant common to both the first metal precursor and the second metal precursor to form a layer of an alloy on the substrate, and purging the processing chamber.

13 Claims, 6 Drawing Sheets

(51) Int. Cl.
*C23C 16/455* (2006.01)
*H01L 21/3205* (2006.01)

(58) Field of Classification Search
CPC ......... H01L 21/28562; H01L 21/76841; H01L 21/02205
See application file for complete search history.

(56) References Cited

U.S. PATENT DOCUMENTS

| | | |
|---|---|---|
| 2006/0110930 A1* | 5/2006 | Senzaki .............. C23C 16/4481 438/758 |
| 2009/0098276 A1 | 4/2009 | Burrows et al. |
| 2010/0300359 A1* | 12/2010 | Armour ............ C23C 16/45565 118/724 |
| 2013/0288427 A1 | 10/2013 | Hung et al. |
| 2013/0309417 A1 | 11/2013 | Matero et al. |
| 2014/0014745 A1 | 1/2014 | Burrows et al. |
| 2015/0004316 A1 | 1/2015 | Thompson et al. |
| 2015/0007770 A1* | 1/2015 | Chandrasekharan ........................ C23C 16/45572 239/548 |
| 2015/0221507 A1* | 8/2015 | Won .................... C23C 16/5096 438/104 |
| 2017/0029947 A1* | 2/2017 | Kawahara ......... H01L 21/67167 |

OTHER PUBLICATIONS

Chinese Office Action for corresponding Chinese Application No. 201880082209.3 dated May 24, 2022.

* cited by examiner

SYSTEMS AND METHODS FOR HOMOGENOUS INTERMIXING OF PRECURSORS IN ALLOY ATOMIC LAYER DEPOSITION

CROSS-REFERENCE TO RELATED APPLICATIONS

This application is a 371 U.S. National Phase of International Application No. PCT/US2018/064174, filed on Dec. 6, 2018, which claims the benefit of U.S. Provisional Application No. 62/608,273, filed on Dec. 20, 2017. The entire disclosures of the applications referenced above are incorporated herein by reference.

FIELD

The present disclosure relates to substrate processing systems and methods, and more particularly to systems and methods for depositing alloy monolayers during atomic layer deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit, etch, ash, clean or otherwise treat film on a substrate such as a semiconductor wafer. During deposition of film, the substrate is exposed to one or more precursors and/or gas mixtures in a processing chamber. During atomic layer deposition (ALD), a plurality of ALD cycles are performed. Each of the ALD cycles deposits a monolayer of film. Each ALD cycle involves exposing the substrate to a precursor, purging, exposing the substrate to a reactant and purging again. In some examples, plasma may be used during some of the steps to cause chemical reactions to occur.

Semiconductor wafers are processed to include components such as transistors, memory, etc. Once integrated into an electronic device and operated, element transport may occur in the components when they are subjected to working temperatures, voltage biases and/or ambient conditions. To prevent element transport, diffusion barriers may be used. Diffusion barriers include a thin conductive layer that is arranged between two other layers to minimize element transport between layers during operation. For example, the diffusion barriers may be located between a metal layer and a dielectric layer or between a dielectric layer and a silicon layer.

Ideal diffusion barrier properties include low diffusivity for an element of interest, thin and uniform layer dimensions, high electrical and thermal conductivity, passive and thermodynamic stability, good adhesion, and good mechanical and thermal stress resistance. Examples of diffusion barriers that have been used include titanium nitride (TiN), ALD metal-organic/inorganic compounds (such as metal nitrides and carbides), tungsten (W) and/or ALD alloys.

ALD alloys provide good thermodynamic stability and low resistivity as compared to metal/organic-inorganic compounds. When depositing an ALD alloy, one or more ALD cycles are used to deposit one or more monolayers of a first metal. Then, one or more ALD cycles are used to deposit one or more monolayers of a second metal on the first metal. Afterwards, annealing is performed to create an alloy of the first and second metals.

Diffusion barriers made of ALD alloy enable effective work function (EWF) tunability by controlling the composition and ratio between the metals. However, in some applications (such as bilayer gate electrodes), the EWF is dominated by the first atomic metal layer that is in contact with the dielectric layer since the EWF is strongly influenced by interface characteristics.

SUMMARY

A method comprises arranging a substrate in a processing chamber, and exposing the substrate to a gas mixture including a first metal precursor gas and a second metal precursor gas to deposit a first metal precursor and a second metal precursor onto the substrate at the same time. The method further comprises purging the processing chamber, supplying a reactant common to both the first metal precursor and the second metal precursor to form a layer of an alloy on the substrate, and purging the processing chamber.

In another feature, the method further comprises supplying the first metal precursor gas and the second metal precursor gas at a predetermined ratio.

In other features, the method further comprises repeating the sequence of exposing the substrate to the gas mixture, purging the processing chamber, supplying the reactant, and purging the processing chamber until a predetermined thickness of the alloy is deposited on the substrate.

In other features, the method further comprises supplying the first metal precursor gas and the second metal precursor gas at a predetermined ratio; repeating the sequence of supplying the first metal precursor gas and the second metal precursor gas, purging the processing chamber, supplying the reactant, and purging the processing chamber; and varying the predetermined ratio when repeating the sequence.

In another feature, the method further comprises varying flow rates of the first metal precursor gas and the second metal precursor gas to vary a metal composition of the alloy.

In other features, the method further comprises selecting a parameter for operating the processing chamber prior to supplying the first metal precursor gas and the second metal precursor gas, and altering the parameter to vary a metal composition of the alloy.

In another feature, the method further comprises forming the layer of the alloy on the substrate without annealing.

In still other features, a method comprises arranging a substrate in a processing chamber, and forming a layer of an alloy on the substrate by: exposing the substrate to a gas mixture including a first metal precursor gas and a second metal precursor gas to deposit a first metal precursor and a second metal precursor onto the substrate at the same time; purging the processing chamber; supplying a first reactant for the first metal precursor; purging the processing chamber; supplying a second reactant for the second metal precursor; and purging the processing chamber.

In another feature, the method further comprises supplying the first metal precursor gas and the second metal precursor gas at a predetermined ratio.

In other features, the method further comprises repeating the sequence of supplying the gas mixture, purging the processing chamber, supplying the first reactant, purging the processing chamber, supplying the second reactant, and purging the processing chamber until a predetermined thickness of the alloy is deposited on the substrate.

In other features, the method further comprises supplying the first metal precursor gas and the second metal precursor gas at a predetermined ratio; repeating the sequence of supplying the first metal precursor gas and the second metal precursor gas, purging the processing chamber, supplying the first reactant, purging the processing chamber, supplying the second reactant, and purging the processing chamber; and varying the predetermined ratio when repeating the sequence.

In another feature, the method further comprises varying flow rates of the first metal precursor gas and the second metal precursor gas to vary a metal composition of the alloy.

In other features, the method further comprises selecting a parameter for operating the processing chamber prior to supplying the first metal precursor gas and the second metal precursor gas, and altering the parameter to vary a metal composition of the alloy.

In another feature, the method further comprises forming the layer of the alloy on the substrate without annealing.

In still other features, a substrate processing system comprises a chamber for processing a semiconductor substrate, and a substrate support arranged in the chamber to support the semiconductor substrate during processing. The substrate processing system further comprises a controller coupled to the chamber to: exposing the semiconductor substrate to a gas mixture including a first metal precursor gas and a second metal precursor gas to deposit a first metal precursor and a second metal precursor onto the semiconductor substrate at the same time; purging the chamber; supplying a reactant common to both the first metal precursor and the second metal precursor to form a layer of an alloy on the semiconductor substrate; and purging the chamber.

In another feature, the substrate processing system further comprises a plurality of plenums configured to supply the first metal precursor gas and the second metal precursor gas to the chamber without intermixing with gases or precursors in other plenums.

In another feature, the controller is configured to control the supply of the first metal precursor gas and the second metal precursor gas from the plurality of plenums to provide a uniform distribution of the first metal precursor and the second metal precursor on the semiconductor substrate.

In another feature, the controller is configured to supply the first metal precursor gas and the second metal precursor gas at a predetermined ratio.

In another feature, the controller is configured to repeat the sequence of supplying the first metal precursor gas and the second metal precursor gas, purging the chamber, supplying the reactant, and purging the chamber until a predetermined thickness of the alloy is deposited on the semiconductor substrate.

In another feature, the controller is configured to: supply the first metal precursor gas and the second metal precursor gas at a predetermined ratio; repeat the sequence of supplying the first metal precursor gas and the second metal precursor gas, purging the chamber, supplying the reactant, and purging the chamber; and vary the predetermined ratio when repeating the sequence.

In another feature, the controller is configured to vary flow rates of the first metal precursor gas and the second metal precursor gas to vary a metal composition of the alloy.

In another feature, the controller is configured to: select a parameter for operating the chamber prior to supplying the first metal precursor gas and the second metal precursor gas; and alter the parameter to vary a metal composition of the alloy.

In still other features, a substrate processing system comprises a chamber for processing a semiconductor substrate, and a substrate support arranged in the chamber to support the semiconductor substrate during processing. The substrate processing system further comprises a controller coupled to the chamber to form a layer of an alloy on the semiconductor substrate by: exposing the semiconductor substrate to a gas mixture including a first metal precursor gas and a second metal precursor gas to deposit a first metal precursor and a second metal precursor onto the semiconductor substrate at the same time; purging the chamber; supplying a first reactant for the first metal precursor; purging the chamber; supplying a second reactant for the second metal precursor; and purging the chamber.

In another feature, the substrate processing system further comprises a plurality of plenums configured to supply the first metal precursor gas and the second metal precursor gas to the chamber without intermixing with gases or precursors in other plenums.

In another feature, the controller is configured to control the supply of the first metal precursor gas and the second metal precursor gas from the plurality of plenums to provide a uniform distribution of the first metal precursor and the second metal precursor on the semiconductor substrate.

In another feature, the controller is configured to supply the first metal precursor gas and the second metal precursor gas at a predetermined ratio.

In another feature, the controller is configured to repeat the sequence of supplying the first metal precursor gas and the second metal precursor gas, purging the chamber, supplying the first reactant, purging the chamber, supplying the second reactant, and purging the chamber until a predetermined thickness of the alloy is deposited on the semiconductor substrate.

In another feature, the controller is configured to: supply the first metal precursor gas and the second metal precursor gas at a predetermined ratio; repeat the sequence of supplying the first metal precursor gas and the second metal precursor gas, purging the chamber, supplying the first reactant, purging the chamber, supplying the second reactant, and purging the chamber; and vary the predetermined ratio when repeating the sequence.

In another feature, the controller is configured to vary flow rates of the first metal precursor gas and the second metal precursor gas to vary a metal composition of the alloy.

In another feature, the controller is configured to: select a parameter for operating the chamber prior to supplying the first metal precursor gas and the second metal precursor gas; and alter the parameter to vary a metal composition of the alloy.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure are used to deposit ALD alloy monolayers without annealing. While the ALD alloy monolayers are used as a diffusion barrier in the examples below, the ALD alloy monolayers can be used in other applications. Metal atom intermixing at the atomic layer level (when deposited as an ALD interlayer alloy) can be accurately controlled by surface chemical absorption/reactions. In contrast, metal atom intermixing using high-temperature post deposition annealing are less accurately controlled by diffusion thermodynamics and kinetics.

Conventional ALD alloys are created by separately depositing one or more first metal monolayers and then one or more second metal monolayers using separate ALD processes followed by annealing to create an alloy. Systems and methods according to the present disclosure expose the substrate to first and second metal precursors so that two or more types of metal atoms are adsorbed (in different locations of the monolayer) at the same time. The processing chamber is purged. Then, the substrate is exposed to a single reactant that is common to both the first and second metal precursors and the processing chamber is purged again. Alternately, the substrate is sequentially exposed to a first reactant for the first metal precursor (followed by purging) and then a second reactant for the second metal precursor (followed by purging). The process can be repeated until a desired thickness is deposited. In some examples, plasma may be used during adsorption or reactant steps to create chemical reactions.

The metal composition of the ALD alloy can be varied by varying the flow rates of the first and second metal precursors during the adsorption step. Alternately, the metal composition of the ALD alloy can be varied by altering one or more of the process parameters. Composition changes can also be created when the first and second metals have different deposition sensitives to a selected process parameter. EWF tunability is determined by the ratio of metals in the ALD alloy. As can be appreciated, the ALD interlayer alloy has reliable EWF tunability starting from a first atomic layer that is in contact with an underlying dielectric layer.

For example, a process sequence for metals A and B includes deposition of $A_xB_y/A_xB_y/A_xB_y \ldots$ to provide a controlled ratio dictated by the values of x and y in each atomic layer. While the same alloy can be deposited for each of the monolayers, the elemental ratio can also be varied for different layers (e.g. $A_xB_y/A_aB_b$ where x, y, a, and b are integers) if desired by altering a flow ratio of the precursors between ALD cycles and/or varying one of the process parameters described above.

The systems and methods for depositing ALD alloy monolayers according to the present disclosure have increased film homogeneity, thermal stability and EWF tunability as compared to metal organic/inorganic diffusion barriers and improved EWF tunability as compared to TiN barriers.

The ALD alloy monolayers provide EWF tunability by selecting metals with varied work function values resulting in a metal alloy that follows a specific mixture rule. ALD alloys as described herein offer inherently high thermodynamic stability (no organic/inorganic components and their segregation upon high temperature annealing). The metallic characteristics of the ALD alloys as described herein have low resistivity as compared to metal/inorganic-organic compounds.

Additional advantages of using ALD alloys as described herein as diffusion barriers include low diffusivity for the element of interest, thin and uniform layer thicknesses, high thermal conductivity for device heat transfer/release, good adhesion to metal layers due to similar metallic characteristics, improved adhesion and lower reactivity with oxide (separately, low work function metals are reactive with oxide and high work function metals have poor adhesion to oxides), and/or improved mechanical stress resistance.

Figure 1A:
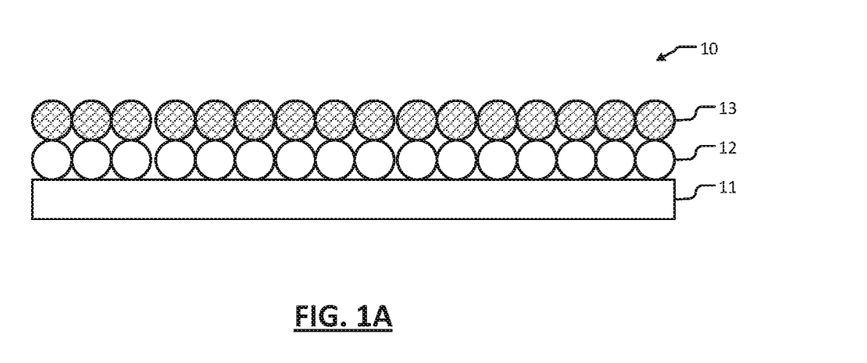
FIG. 1A is a side cross-sectional view of a substrate including a first ALD metal layer and a second ALD metal layer that are subsequently annealed to form an alloy.

Referring now to FIG. 1A, a substrate 10 is shown after ALD of individual metal layers is performed. The substrate 10 includes an underlying layer 11. Atoms of a first metal 12 are deposited on the underlying layer 11 to form a first homogenous monolayer. Atoms of a second metal 13 are deposited to form a second homogenous monolayer arranged on the first homogenous monolayer. The process may be repeated one or more times for each of the layers. Annealing is subsequently performed to create an alloy.

Figure 1B:
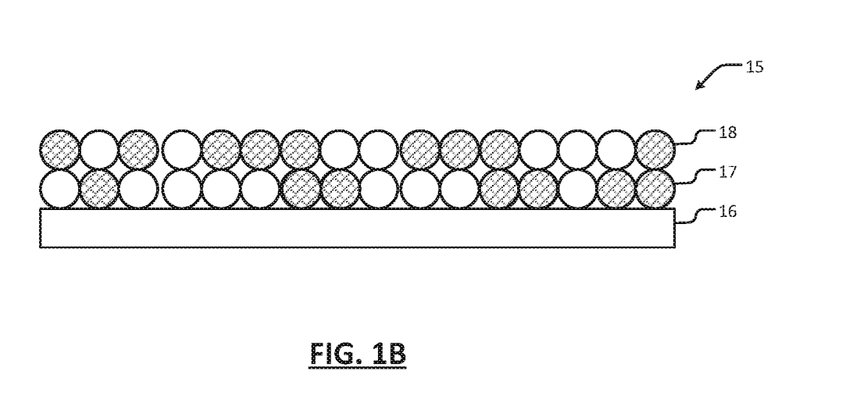
FIG. 1B is a side cross-sectional view of a substrate including first and second ALD alloy monolayers according to the present disclosure.

Referring now to FIG. 1B, a substrate 15 is shown after the ALD alloy according to the present disclosure is deposited (and without annealing). The substrate 15 includes an underlying layer 16. During the first ALD cycle, atoms of a first metal 17 and a second metal 18 are deposited on the underlying layer 16 at the same time to form a first ALD alloy monolayer. During a second ALD cycle, atoms of the first metal 17 and the second metal 18 are deposited at the same time to form a second ALD alloy monolayer arranged on the first ALD alloy monolayer. The process may be repeated one or more times for each of the layers.

Figure 2:
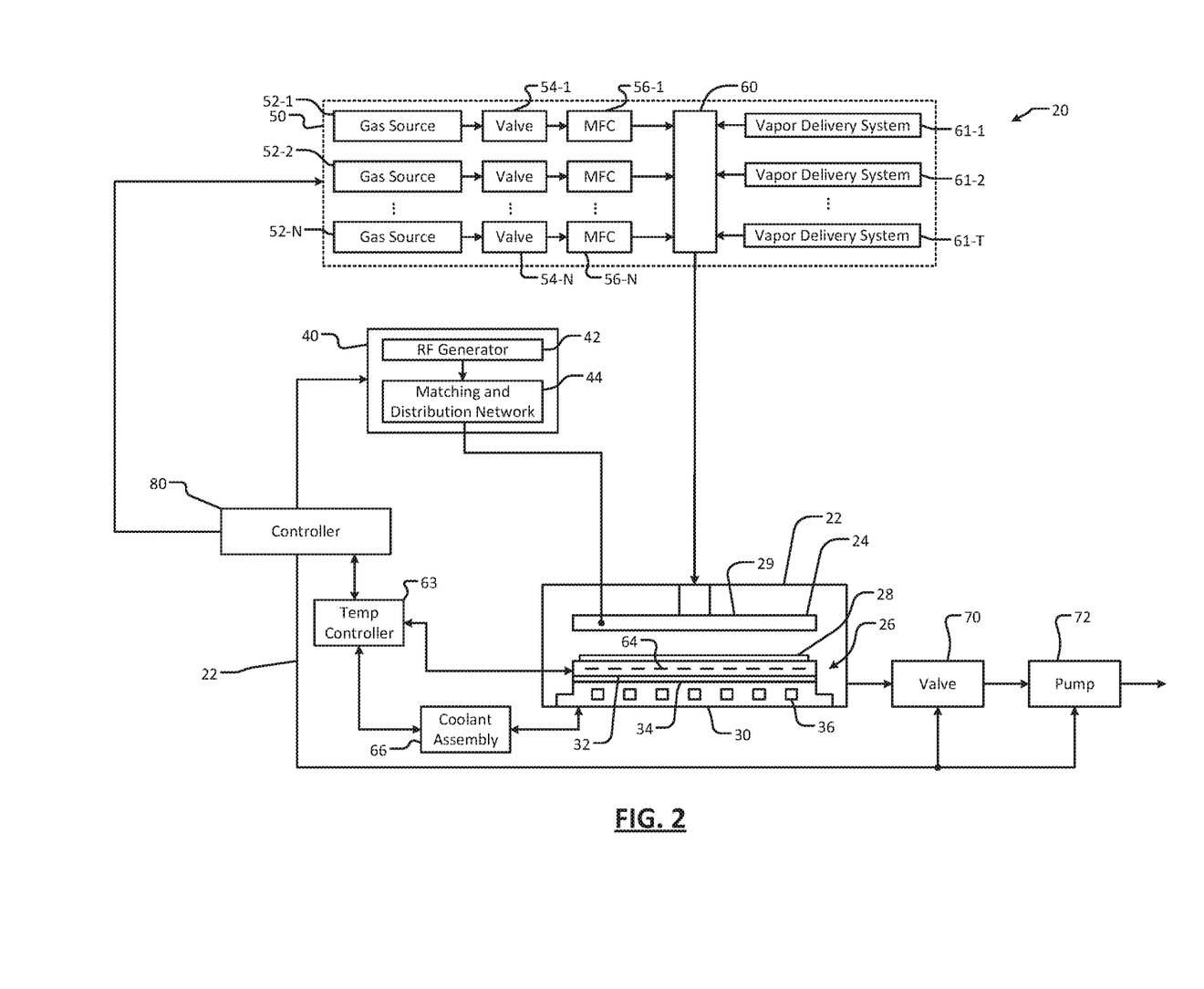
FIG. 2 is a functional block diagram of an example of a substrate processing chamber for depositing ALD alloy monolayers according to the present disclosure.
Figure 4:
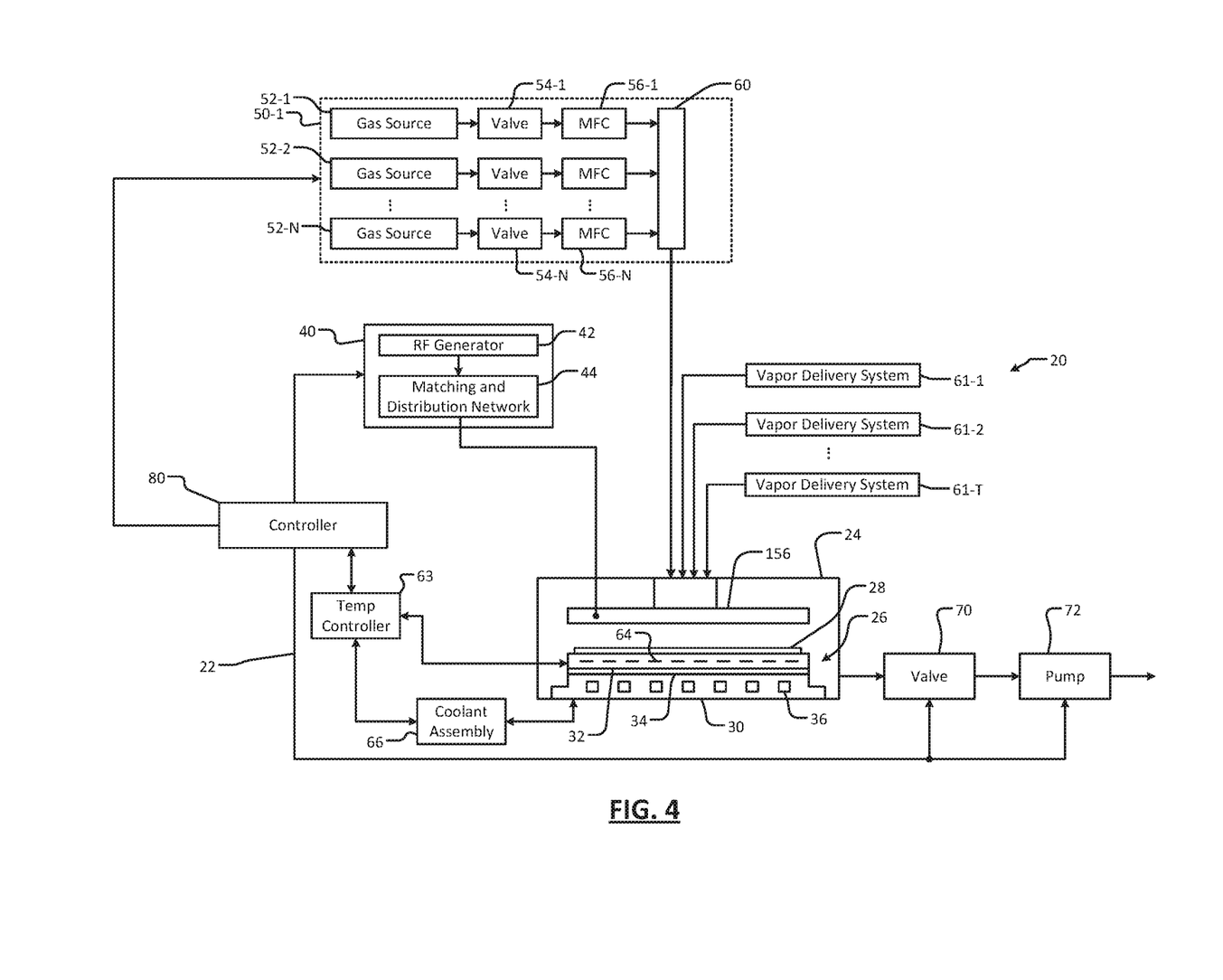
FIG. 4 is a functional block diagram of another example of a substrate processing chamber for depositing ALD alloy monolayers according to the present disclosure.

Referring now to FIGS. 2 and 4 below, examples of variations in delivery of one or more metal precursors to the processing chamber are shown. In FIG. 2, gas mixtures and/or vaporized precursors are delivered to a common manifold for mixing prior to delivery to a gas distribution device such as a showerhead. In FIG. 4, the gas mixtures and/or vaporized precursors are mixed in the gas distribution device or a multi-plenum gas distribution device is used and mixing does not occur until the processing chamber.

In FIG. 2, an example substrate processing system 20 is shown. The substrate processing system 20 includes a processing chamber 22 that encloses other components of the substrate processing system 20 and contains the RF plasma (if used). The substrate processing system 20 includes an upper electrode 24 and an electrostatic chuck (ESC) 26 or other substrate support. During operation, a substrate 28 is arranged on the ESC 26.

For example only, the upper electrode 24 may include a gas distribution device 29 such as a showerhead that introduces and distributes process gases. The gas distribution device 29 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, other process gases or purge gas flows. Alternately, the upper electrode 24 may include a conducting plate and the process gases may be introduced in another manner.

The ESC 26 includes a baseplate 30 that acts as a lower electrode. The baseplate 30 supports a heating plate 32, which may correspond to a ceramic multi-zone heating plate. A thermal resistance layer 34 may be arranged between the heating plate 32 and the baseplate 30. The baseplate 30 may include one or more channels 36 for flowing coolant through the baseplate 30.

If plasma is used, an RF generating system 40 generates and outputs an RF voltage to one of the upper electrode 24 and the lower electrode (e.g., the baseplate 30 of the ESC 26). The other one of the upper electrode 24 and the baseplate 30 may be DC grounded, AC grounded or floating. For example only, the RF generating system 40 may include an RF generator 42 that generates RF power that is fed by a matching and distribution network 44 to the upper electrode 24 or the baseplate 30. In other examples, the plasma may be generated inductively or remotely.

A gas delivery system 50 includes one or more gas sources 52-1, 52-2, . . . , and 52-N (collectively gas sources 52), where N is an integer greater than zero. The gas sources 52 are connected by valves 54-1, 54-2, . . . , and 54-N (collectively valves 54) and mass flow controllers 56-1, 56-2, . . . , and 56-N (collectively mass flow controllers 56) to a manifold 60. While a single gas delivery system 50 is shown, two or more gas delivery systems can be used. If vaporized precursor is used, one or more vapor delivery systems 61-1, 61-2, . . . , 61-V (collectively vapor delivery system 61) can be used to supply one or more vaporized precursors to the manifold 60 or another manifold (not shown) that is connected to the processing chamber. For example, the vaporized precursors can include metal precursors. Alternately, if the metal precursors can be delivered as gases, one or more of the vapor delivery systems may be omitted. An output of the manifold 60 is fed to the processing chamber 22.

A temperature controller 63 may be connected to a plurality of thermal control elements (TCEs) 64 arranged in the heating plate 32. The temperature controller 63 may be used to control the plurality of TCEs 64 to control a temperature of the ESC 26 and the substrate 28. The temperature controller 63 may communicate with a coolant assembly 66 to control coolant flow through the channels 36. For example, the coolant assembly 66 may include a coolant pump, a reservoir and/or one or more temperature sensors. The temperature controller 63 operates the coolant assembly 66 to selectively flow the coolant through the channels 36 to cool the ESC 26.

A valve 70 and pump 72 may be used to evacuate reactants from the processing chamber 22. A system controller 80 may be used to control components of the substrate processing system 20.

Figure 3:
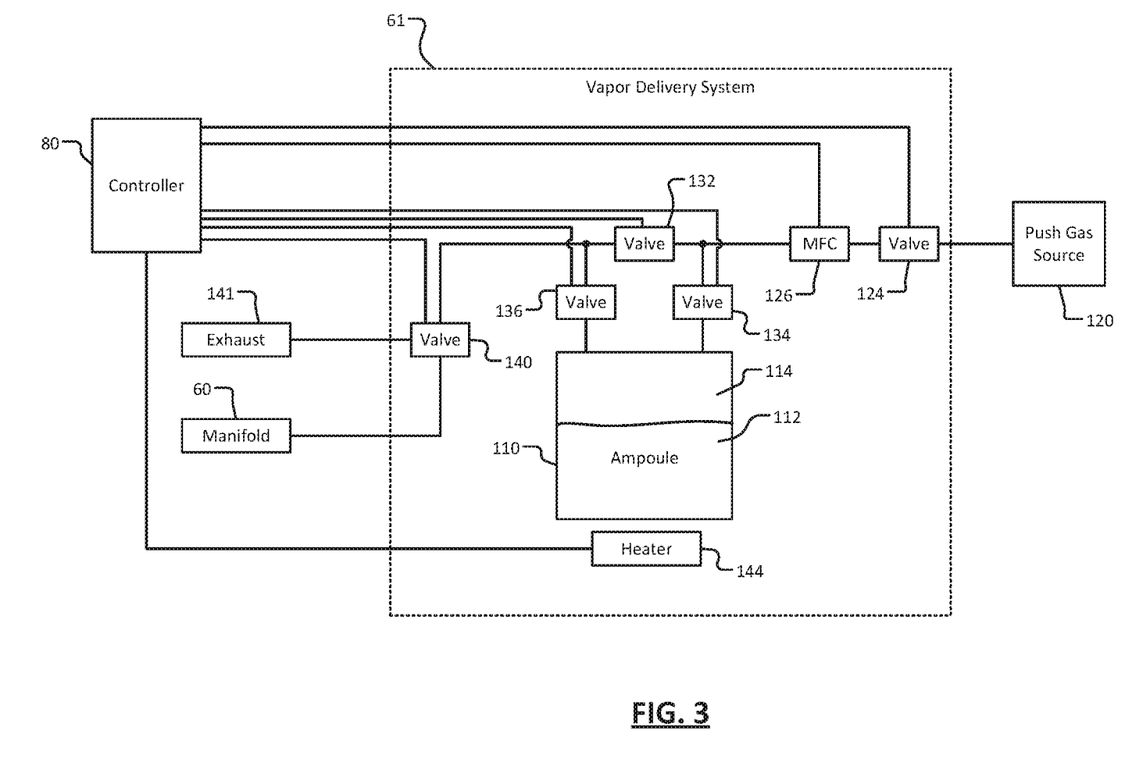
FIG. 3 is a functional block diagram of an example of a vapor delivery system.

Referring now to FIG. 3, the vapor delivery system 61 receives gas from a push gas source 120. In some examples, the push gas source includes one or more inert gases or carrier gases. A flow rate of push gas output by the push gas source 120 is modulated by a mass flow controller (MFC) 126 or other flow control device. A valve 124 may be arranged between the push gas source 120 and the MFC 126. An output of the MFC 126 is connected to inlets of valves 132 and 134. An outlet of the valve 134 is connected to an ampoule 110 containing liquid precursor 112 and vaporized precursor 114. An outlet of the valve 132 is connected to an inlet of a valve 136 and an inlet of a valve 140. An outlet of the valve 136 is connected to an outlet of the ampoule 110. Outlets of the valve 140 are connected to the manifold 60 and an exhaust system 141.

When not in use, the valves 132, 134 and 136 may be in a closed state. During a period immediately prior to deposition, the valve 140 may be arranged in a diverting position to an exhaust system 141 to allow flow of the vaporized precursor to reach steady state. During this period the valves 134 and 136 are opened and the valve 132 is closed. Push gas from the push gas source 120 is directed through the valve 134, the ampoule 110, the valve 136 and the valve 142 into the exhaust system 141.

During deposition, the valve 140 is arranged in a non-diverting position to allow the vaporized precursor to flow to the manifold 60 rather than the exhaust system 141. During deposition, the valves 134 and 136 are opened and the valve 132 is closed. Push gas from the push gas source 120 is directed through the valve 134, the ampoule 110, the valve 136 and the valve 142 into the manifold 60.

In FIG. 4, mixing of the process gases and/or the vaporized precursor is performed in the gas distribution device or in the processing chamber if a gas distribution device 156 having more than one plenum is used.

Figure 5A:
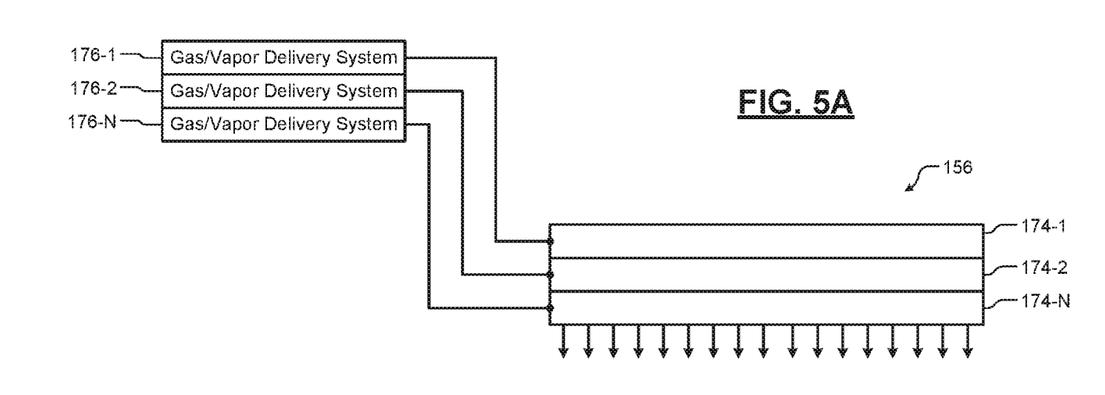
FIG. 5A is a functional block diagram of a gas distribution device including multiple plenums for separately delivering multiple precursors and/or reactants to the processing chamber without intermixing according to the present disclosure.

Referring now to FIGS. 5A and 5B, an example of the gas distribution device 156 is shown. In FIG. 5A, the gas distribution device 156 includes multiple plenums 174-1, 174-2, . . . , and 174-P (collectively plenums 174) is shown. Gases and/or precursors are delivered to the processing chamber by the plenums without intermixing with gases or precursors in other plenums. Gas or vapor delivery systems 176-1, 176-2, . . . , and 176-P supply gas or vaporized precursor to the plenums 174-1, 174-2, . . . , and 174-P, respectively. In this example, the plenums are stacked in an axial direction relative to the substrate. However, the plenums 174 may also be arranged in a radial direction as well. In some examples, the through holes corresponding to each of the plenums 174 are uniformly arranged in a radial and/or azimuthal direction to provide uniform distribution on the underlying substrate.

Figure 5B:
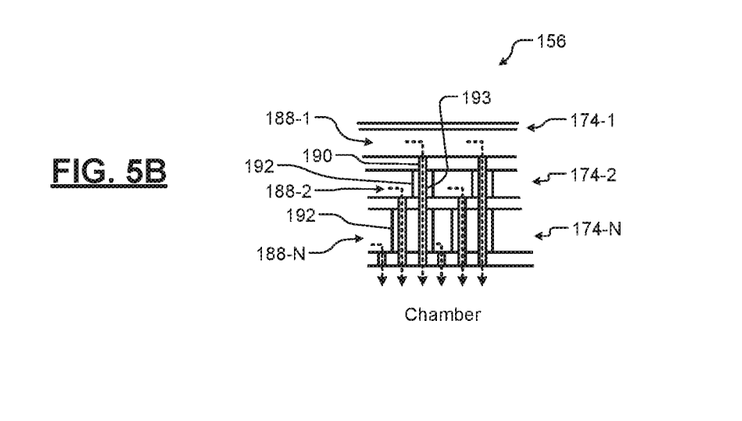
FIG. 5B is a side cross-sectional view of the gas distribution device of FIG. 5A.

In FIG. 5B, each of the plenums 174-1, 174-2, . . . , and 174-N includes a plurality of through holes 190. In some examples, the plenums 174 are generally shaped like flat cylinders. To maintain separation of gas mixtures from the plenum 174-1, posts 192 with corresponding aligned through holes 193 are arranged in lower plenums 174-2 . . . 174-P to allow the gas mixture in the plenum 174-1 to travel through the holes 190, 193 to reach the processing chamber without intermixing in the plenums 174-2 . . . 174-P. A similar approach is used for other ones of the plenums 174.

Figure 6:
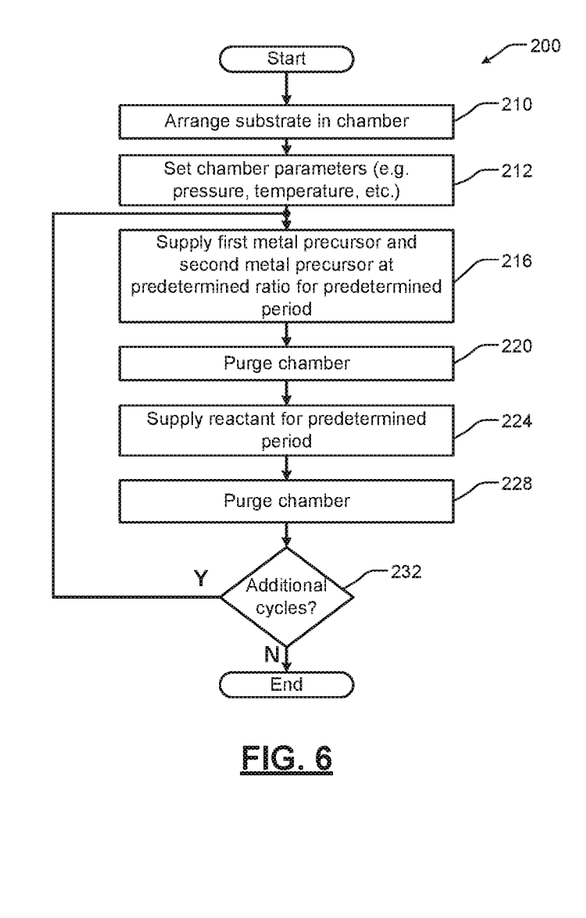
FIG. 6 is a flowchart illustrating an example of a method for depositing an ALD alloy according to the present disclosure.

Referring now to FIG. 6, a method 200 for performing ALD according to the present disclosure is shown. At 210, a substrate is arranged in a chamber. At 212, chamber pressure, processing temperature and/or other processing parameters (such as plasma power and frequency, etc.) are set. At 216, the substrate is exposed to a first metal precursor and a second metal precursor in the processing chamber. In some examples, the first metal precursor and the second metal precursor are delivered to the processing chamber at a predetermined ratio and the substrate is exposed to both precursors for a predetermined period.

At 220, after the predetermined period, the processing chamber is purged. In some examples, one or more inert gases such as helium (He), argon (Ar), neon (Ne), krypton (Kr), xenon (Xe), and/or radon (Rn) are used. At 224, a reactant that is common to the first and second metal precursors is supplied to the processing chamber for a predetermined period. At 228, the processing chamber is purged. At 232, the method determines whether additional cycles are to be performed. If 232 is true, the method returns to 216. Otherwise the method ends.

Figure 7:
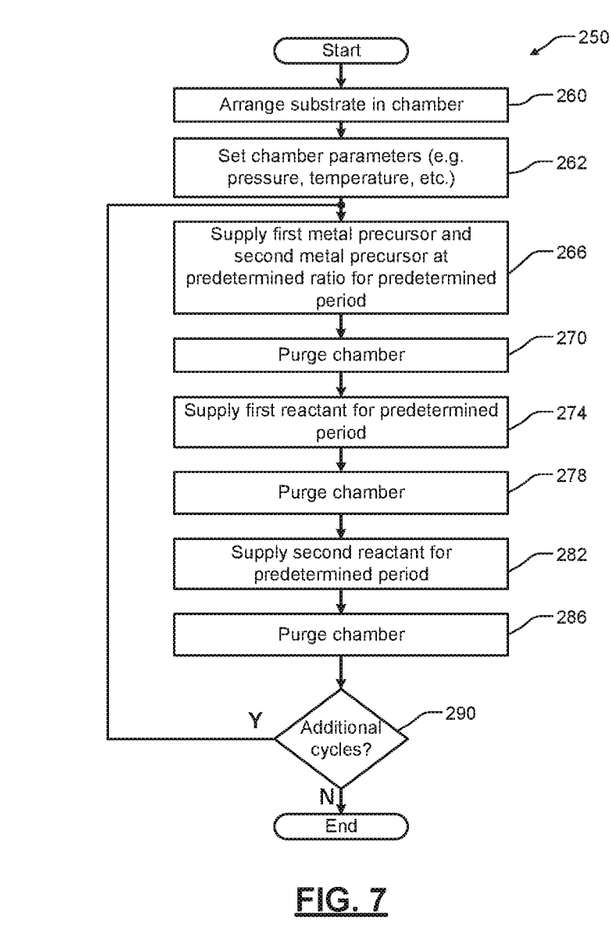
FIG. 7 is a flowchart illustrating another example of a method for depositing an ALD alloy according to the present disclosure.

Referring now to FIG. 7, a method 250 for performing ALD according to the present disclosure is shown. At 260, a substrate is arranged in a chamber. At 262, chamber pressure, processing temperature and other processing parameters (such as plasma power and frequency, etc.) are set. At 266, the substrate is exposed to a first metal precursor and a second metal precursor in the processing chamber. In some examples, the first metal precursor and the second metal precursor are delivered to the processing chamber at a predetermined ratio and the substrate is exposed to both precursors for a predetermined period.

At 270, after the predetermined period, the processing chamber is purged. At 274, a reactant corresponding to one of the first metal precursor and the second metal precursor is supplied to the processing chamber for a predetermined period. At 278, the processing chamber is purged. At 282, a reactant corresponding to the other one of the first metal precursor and the second metal precursor is supplied to the processing chamber for a predetermined period. At 286, the processing chamber is purged. At 290, the method determines whether additional cycles are to be performed. If 290 is true, the method returns to 266. Otherwise the method ends.

In some examples, the metals in the ALD alloy are selected based upon tunability of the EWF and a scaling factor. Other factors for selecting the metals in the metal alloy include melting temperature, resistivity, passivity/reactivity, immiscibility with metallization, etc. In some examples, the metals in the metal alloy include at least one of the following metals: hafnium (HF), nickel (Ni), aluminum (Al), platinum (Pt), yttrium (Y), titanium (Ti), tungsten (W) and other suitable metals. In some examples, the reactant includes molecular hydrogen ($H_2$), ammonia ($NH_3$) or other suitable reactant.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the processing chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
   a chamber for processing a semiconductor substrate;
   a substrate support arranged in the chamber to support the semiconductor substrate during processing;
   a gas distribution device arranged in the chamber, the gas distribution device comprising a plurality of plenums, the plenums being disjoint from each other and configured to respectively supply into the chamber a first metal precursor gas, a second metal precursor gas, and a reactant via through holes in the respective plenums without intermixing the first metal precursor gas, the second metal precursor gas, and the reactant in the plenums, the plurality of plenums being stacked in a sequential order in an axial direction relative to the semiconductor substrate, each plenum of the plurality of plenums extending radially fully across the semiconductor substrate, and the through holes of the respective plenums being arranged in a radial direction that is perpendicular to the axial direction in the same sequential order as the sequential order of the plenums, the through holes of the plenums opening along a flat surface at a bottom of the gas distribution device, the flat surface extending radially fully across the bottom of the gas distribution device; and
   a controller coupled to the chamber to:
      expose the semiconductor substrate to a gas mixture including the first metal precursor gas and the second metal precursor gas to deposit a first metal precursor and a second metal precursor onto the semiconductor substrate at the same time;
      purge the chamber;
      supply the reactant to form a layer of an alloy on the semiconductor substrate; and
      purge the chamber.

2. The substrate processing system of claim 1 wherein the controller is configured to control the supply of the first metal precursor gas and the second metal precursor gas from the plurality of plenums to provide a uniform distribution of the first metal precursor and the second metal precursor on the semiconductor substrate.

3. The substrate processing system of claim 1 wherein the controller is configured to at least one of:
   supply the first metal precursor gas and the second metal precursor gas at a predetermined ratio; and
   vary flow rates of the first metal precursor gas and the second metal precursor gas to vary a metal composition of the alloy.

4. The substrate processing system of claim 1 wherein the controller is configured to repeat a sequence of supplying the first metal precursor gas and the second metal precursor gas, purging the chamber, supplying the reactant, and purging the chamber until a predetermined thickness of the alloy is deposited on the semiconductor substrate.

5. The substrate processing system of claim 1 wherein the controller is configured to:
   supply the first metal precursor gas and the second metal precursor gas at a predetermined ratio; and
   repeat a sequence of supplying the first metal precursor gas and the second metal precursor gas, purging the chamber, supplying the reactant, and purging the chamber; and
   vary the predetermined ratio when repeating the sequence.

6. The substrate processing system of claim 1 wherein the reactant is common to both the first metal precursor and the second metal precursor.

7. The substrate processing system of claim 1 wherein the reactant is for the first metal precursor, and wherein the controller is configured to supply a second reactant for the second metal precursor through one of the plenums used to supply the reactant.

8. The substrate processing system of claim 7 wherein the controller is configured to:
   supplying the second reactant after performing the purging following the supply of the reactant; and
   purging the chamber.

9. The substrate processing system of claim 8 wherein the controller is configured to repeat a sequence of supplying the gas mixture, purging the chamber, supplying the reactant, purging the chamber, supplying the second reactant, and purging the chamber until a predetermined thickness of the alloy is deposited on the semiconductor substrate.

10. The substrate processing system of claim 8 wherein the controller is configured to:
   supply the first metal precursor gas and the second metal precursor gas at a predetermined ratio;
   repeat a sequence of supplying the first metal precursor gas and the second metal precursor gas, purging the chamber, supplying the reactant, purging the chamber, supplying the second reactant, and purging the chamber; and
   varying the predetermined ratio when repeating the sequence.

11. The substrate processing system of claim 1 wherein the through holes of the plenums are uniformly arranged in a radial and/or azimuthal direction.

12. The substrate processing system of claim 1 wherein the controller is configured to:
   select a parameter for operating the chamber prior to supplying the first metal precursor gas and the second metal precursor gas; and
   alter the parameter to vary a metal composition of the alloy.

13. The substrate processing system of claim 1 wherein the reactant is for the first metal precursor, and wherein the controller is configured to supply a second reactant for the second metal precursor through a different plenum than the plenum used to supply the reactant.

* * * * *